(12) United States Patent
Akou et al.

(10) Patent No.: US 10,056,315 B2
(45) Date of Patent: Aug. 21, 2018

(54) SEMICONDUCTOR DEVICE

(71) Applicant: Toshiba Memory Corporation, Minato-ku (JP)

(72) Inventors: Masayuki Akou, Yokohama (JP); Hiromasa Yoshimori, Yokohama (JP); Yoshihiro Sobue, Kamakura (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 11 days.

(21) Appl. No.: 15/450,422

(22) Filed: Mar. 6, 2017

(65) Prior Publication Data

US 2018/0068928 A1    Mar. 8, 2018

Related U.S. Application Data

(60) Provisional application No. 62/383,008, filed on Sep. 2, 2016.

(51) Int. Cl.
*H01L 23/00* (2006.01)
*H01L 23/48* (2006.01)
*H01L 23/498* (2006.01)

(52) U.S. Cl.
CPC ...... *H01L 23/481* (2013.01); *H01L 23/49827* (2013.01); *H01L 24/16* (2013.01); *H01L 2224/16146* (2013.01); *H01L 2924/1438* (2013.01)

(58) Field of Classification Search
CPC .................................................. H01L 23/481
See application file for complete search history.

(56) References Cited

U.S. PATENT DOCUMENTS 9,214,411 B2    12/2015  Park et al.
2014/0284690 A1*  9/2014  Arai ................ H01L 29/792
                                                      257/324

FOREIGN PATENT DOCUMENTS

| JP | 8-153860 | 6/1996 |
| JP | 2014-187183 | 10/2014 |
| JP | 2015-79961 | 4/2015 |

* cited by examiner

*Primary Examiner* — William Harriston
(74) *Attorney, Agent, or Firm* — Oblon, McClelland, Maier & Neustadt, L.L.P.

(57) ABSTRACT

A semiconductor device of an embodiment includes a semiconductor layer, a first conductor, a first conductive layer, a first insulating layer, a second conductive layer, and a plurality of second conductors. The semiconductor layer has a first region and a second region. The first conductor is provided in the semiconductor layer. The first conductive layer is electrically connected to the first conductor. The first insulating layer is provided in the semiconductor layer with at least part of the first insulating layer being provided between the first conductive layer and the semiconductor layer. A distance from the first insulating layer to the first region is smaller than a distance to the second region. A first distance to the first region from a plane that includes a first interface between the first insulating layer and the first conductive layer is larger than a second distance from the plane to the second region.

19 Claims, 10 Drawing Sheets

SEMICONDUCTOR DEVICE

CROSS-REFERENCE TO RELATED APPLICATION

This application is based upon and claims the benefit of priority from U.S. Provisional Application No. 62/383,008, filed on Sep. 2, 2016, the entire contents of which are incorporated herein by reference.

FIELD

Embodiments described herein relate generally to semiconductor devices.

BACKGROUND

A through silicon via (TSV) is used to electrically connect stacked semiconductor devices. By use of the TSV, the capacitance and resistance required for connection of the semiconductor devices can be decreased. This leads to lower power consumption and higher operational speed of the stacked semiconductor devices.

DETAILED DESCRIPTION

Embodiments will be described below by referring to the accompanying drawings. Same or similar members of the embodiments are indicated by the same reference signs.

First Embodiment

A semiconductor device according to the present embodiment includes, a semiconductor layer having a first region and a second region, a first conductor provided in the semiconductor layer, a first conductive layer electrically connected to the first conductor, a first insulating layer, at least a part of the first insulating layer being provided in the semiconductor layer, at least apart of the first insulating layer being provided between the first conductive layer and the semiconductor layer, the first insulating layer surrounding the first conductor, a distance from the first insulating layer to the first region being smaller than a distance from the first insulating layer to the second region, a first distance to the first region from a plane that includes a first interface between the first insulating layer and the first conductive layer being larger than a second distance to the second region from the plane, a second conductive layer, the first conductive layer being interposed between the second conductive layer and the first conductor, and a plurality of second conductors provided between the second conductive layer and the first conductive layer, the plurality of second conductors electrically connecting the second conductive layer and the first conductive layer.

Figure 1:
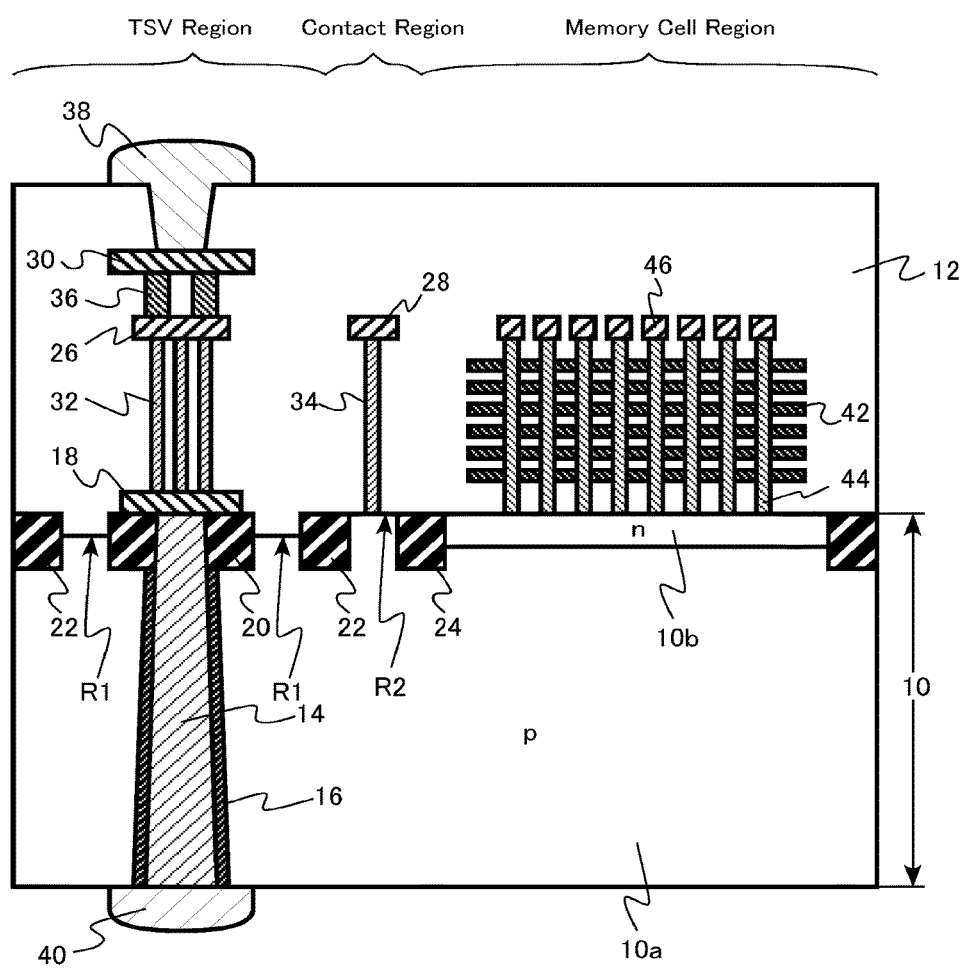
FIG. 1 is a schematic view of a semiconductor device according to a first embodiment.
Figure 2A:
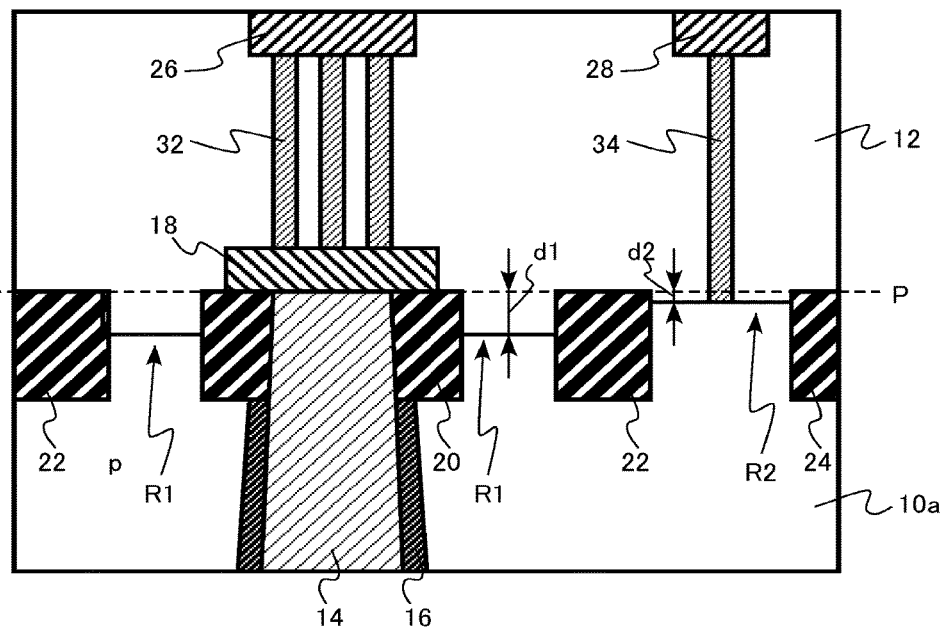
FIGS. 2A, 2B are schematic views of the semiconductor device according to the first embodiment.
Figure 2B:
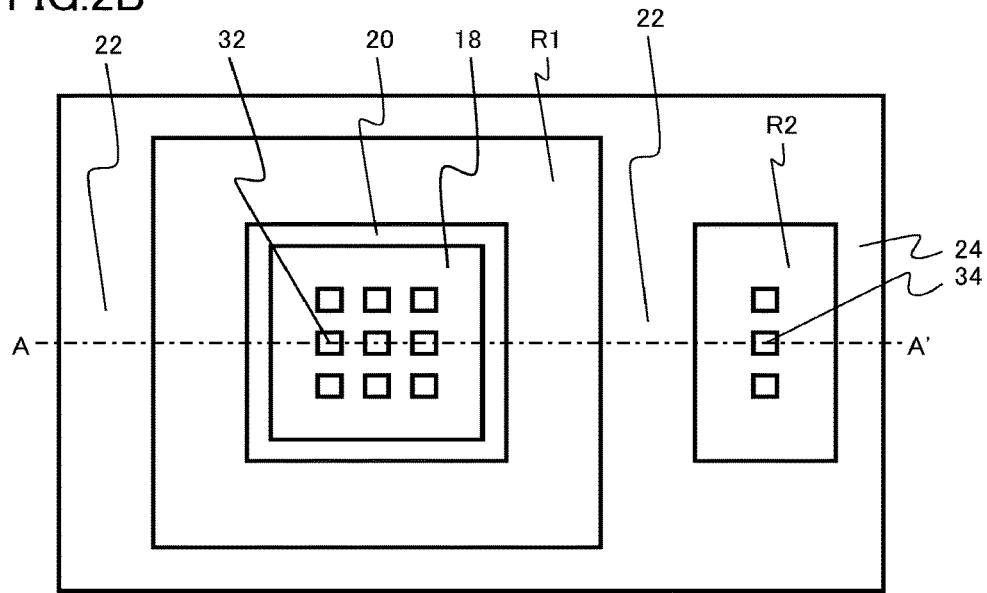

FIGS. 1, 2A, and 2B are schematic views of a semiconductor device of the present embodiment. FIG. 1 is a schematic cross-sectional view of the semiconductor device of the present embodiment. FIG. 2A is a schematic cross-sectional view of main components of the present embodiment. FIG. 2B is a top view of the main components of the present embodiment. FIG. 2A is a cross-sectional view cut along line AA' of FIG. 2B. A semiconductor device of the present embodiment is a NAND-type nonvolatile memory including a TSV. The nonvolatile memory of the present embodiment has a three-dimensional structure in which memory cells distributed three-dimensionally.

The nonvolatile memory of the embodiment includes a TSV region, a contact region, and a memory cell region. FIGS. 2A, 2B are enlarged views of the TSV region and the contact region, respectively.

The nonvolatile memory of the present embodiment includes a semiconductor substrate 10 (semiconductor layer), an interlayer insulating layer 12, a through-via (first conductor) 14, a sidewall insulating film 16, a first pad layer 18 (first conductive layer), a first buried insulating layer 20 (first insulating layer), a second buried insulating layer 22 (second insulating layer), a third buried insulating layer 24, a second pad layer 26 (second conductive layer), a wiring layer 28 (third conductive layer), a third pad layer 30, a first contact plug 32 (second conductor), a second contact plug 34 (third conductor), a third contact plug 36, a front bump 38, a back bump 40, a word line 42, a channel layer 44, and a bit line 46.

The semiconductor substrate 10 includes a front surface and a back surface. The front surface is an upper surface and the back surface is a lower surface in FIG. 1. The semiconductor substrate 10 includes a p-type region 10a and an n-type source region 10b.

The semiconductor substrate 10 has a thickness of, for example, from 30 μm to 50 μm. The semiconductor substrate 10 is made of, for example, silicon.

The semiconductor substrate 10 includes a first region R1 and a second region R2 on the front surface side. A distance between the first region R1 and the first buried insulating layer 20 is smaller than a distance between the second region R2 and the first buried insulating layer 20.

The first region R1 is provided to surround the first buried insulating layer 20. The first region R1 prevents dishing of the front surface of the first buried insulating layer 20 when the first, second, and third buried insulating layers 20, 22, 24 are formed by chemical mechanical polishing (CMP).

A plane including an interface (first interface) between the first pad layer 18 and the first buried insulating layer 20 is defined as a plane P (indicated by a broken line in FIG. 2A). A distance (d1 in FIG. 2A) from the plane P to the first region R1 is larger than a distance (d2 in FIG. 2A) from the plane P to the second region R2. In other words, the distance from the back surface of the semiconductor substrate 10 to the front surface of the first region R1 is smaller than the distance from the back surface of the semiconductor substrate 10 to the front surface of the second region R2.

The distance d1 is, for example, from 1.5 to 10 times larger than the distance d2. A difference between the distance d1 and d2 is, for example, from 20 nm to 100 nm.

The distance d1 that is larger than the distance d2 is achieved, for example, by selectively etching the first region R1. Etching of the first region R1 is executed following the etching of the first, second, and third buried insulating layers 20, 22, 24 by CMP.

The first, second, and third buried insulating layers 20, 22, 24 are provided in the semiconductor substrate 10. The first, second, and third buried insulating layers 20, 22, 24 are provided on the front surface side of the semiconductor substrate 10. The first, second, and third buried insulating layers 20, 22, 24 act as element isolation regions. The first, second, and third buried insulating layers 20, 22, 24 are so-called shallow trench isolation (STI).

The first, second, and third buried insulating layers 20, 22, 24 has a thickness of, for example, from 200 nm to 500 nm. The first, second, and third buried insulating layers 20, 22, 24 are made of, for example, silicon oxide.

At least part of the first buried insulating layer 20 is provided between the first pad layer 18 and the semiconductor substrate 10. The first buried insulating layer 20 surrounds a through-via 14.

The second buried insulating layer 22 is located between the first region R1 and the second region R2. The second region R2 is located between the second and third buried insulating layers 22, 24.

The through-via 14 is provided in a TSV region. The through-via 14 is provided in the semiconductor substrate 10. The through-via 14 is provided penetrating through the semiconductor substrate 10 from the back surface side to the front surface side of the semiconductor substrate 10. The through-via 14 penetrates the first buried insulating layer 20. The through-via 14 is in contact with the first pad layer 18. The first buried insulating layer 20 acts as an etching stopper in etching contact holes for the through-via 14.

The through-via 14 is made of metal. The through-via 14 is in a stacked structure of, for example, a barrier metal and a buried metal. The barrier metal is, for example, titanium nitride. The buried metal is, for example, nickel.

A sidewall insulating film 16 is provided between the through-via 14 and the semiconductor substrate 10. The sidewall insulating film 16 electrically isolate the through-via 14 from the semiconductor substrate 10. The sidewall insulating film 16 is, for example, silicon oxide.

The first pad layer 18 is provided on the first buried insulating layer 20. The first pad layer 18 is in a stacked structure of, for example, a polycrystal silicon layer, in which a conductive impurity is introduced, and a metal layer. The metal layer is made of, for example, tungsten.

The end portion of the first pad layer 18 is located on the first buried insulating layer 20.

The second pad layer 26 is a metal layer. The second pad layer 26 is made of, for example, a metal containing copper.

A plurality of first contact plugs 32 is provided between the second pad layer 26 and the first pad layer 18. The first contact plugs 32 electrically connect the second pad layer 26 and the first pad layer 18. The first contact plugs 32 are physically in contact with the second pad layer 26 and the first pad layer 18.

The first contact plugs 32 are made of metal. The first contact plugs 32 are made of, for example, tungsten.

The first contact plugs 32 each have an aspect ratio of, for example, at least 20. The aspect ratio of the first contact plugs 32 is a value obtained by dividing a length of the individual first contact plugs 32 by a diameter of the end portion of the first contact plugs 32 on the first pad layer 18 side.

The third pad layer 30 is a metal layer. The third pad layer 30 is made of, for example, a metal containing aluminum.

The third contact plugs 36 are provided between the third pad layer 30 and the second pad layer 26. The third contact plugs 36 electrically connect the third pad layer 30 and the second pad layer 26. The third contact plugs 36 are physically in contact with the third pad layer 30 and the second pad layer 26.

The third contact plugs 36 are made of metal. The third contact plugs 36 are made of, for example, a metal containing aluminum.

A front bump 38 is electrically connected to the third pad layer 30. The third pad layer 30 is made of metal. The front bump 38 is made of, for example, a metal containing copper.

The back bump 40 is electrically connected to the through-via 14. The back bump 40 is provided on the back surface side of the semiconductor substrate 10.

The back bump 40 is made of metal. The back bump 40 is made of, for example, a tin alloy. An insulating film which is not illustrated is provided between the back bump 40 and the semiconductor substrate 10.

The front bump 38 and the back bump 40 act as members for connecting a plurality of nonvolatile memories of the present embodiment electrically and physically in stacking the nonvolatile memories.

The contact region includes the wiring layer 28 and the second contact plug 34. The wiring layer 28 is a metal layer. The wiring layer 28 is made of, for example a metal containing copper.

The second contact plug 34 electrically connects the wiring layer 28 and the second region R2. The second contact plug 34 is physically in contact with the wiring layer 28 and the second region R2.

The second contact plug 34 is made of metal. The second contact plug 34 is made of, for example, tungsten.

The wiring layer 28 and the second contact plug 34 are used to apply an electric potential to the p-type region 10a of the semiconductor substrate 10, and the potential of the p-type region 10a is fixed. The p-type region 10a is, for example, at the ground potential.

The wiring layer 28 and the second contact plug 34 are formed, for example, simultaneously with the second pad layer 26 and the first contact plugs 32.

A concentration of the p-type impurity in the second region R2 is higher than a concentration of the p-type impurity in the p-type region 10a in order to decrease the contact resistance of the second contact plug 34 at the second region R2.

A memory cell region includes the n-type source region 10b, a plurality of word lines 42, a plurality of channel layers 44, and a plurality of bit lines 46.

The plurality of word lines 42 are stacked upward on the front surface side of the semiconductor substrate 10. The plurality of word lines 42 extend in parallel with the front surface of the semiconductor substrate 10. The number of stacked layers is, for example, from 20 to 100 layers. The word lines 42 are made of, for example, metal.

The plurality of channel layers 44 is provided to cross the word lines 42. The channel layers 44 extend in a direction vertical to the front surface of the semiconductor substrate 10. One ends of the channel layers 44 are electrically connected to the source region 10b. The channel layers 44 are made of, for example, polycrystalline silicon.

The plurality of bit lines 46 extend in parallel with the front surface of the semiconductor substrate 10. The ends of the channel layers 44 opposite to the semiconductor substrate 10 side are electrically connected to the bit lines 46.

A charge storage layer which is not illustrated is provided, for example, at each crossing of the word lines 42 and the channel layers 44. Each crossing of the word lines 42 and the channel layers 44 acts as a nonvolatile memory cell. The nonvolatile memory has a three-dimensional structure in which the memory cells are distributed three dimensionally both in parallel and vertical directions relative to the front surface of the semiconductor substrate 10.

The interlayer insulating layer 12 electrically isolates the semiconductor substrate, the pad layers, the wiring layer, the contact plugs, and so on in the TSV region, the contact region, and the memory cell region. The interlayer insulating layer 12 may be made of any material. For example, silicon oxide, silicon nitride, resin, or a stacked film of these materials may be used.

Next, a function and an effect of the semiconductor device of the present embodiment is described.

For example, the TSV is used to electrically connect the stacked nonvolatile memories. By use of the TSV, the capacitance and resistance required for connection of the nonvolatile memories can be decreased. This leads to lower power consumption and higher operational speed of the stacked nonvolatile memories.

Meanwhile, the three-dimensional structure for vertically stacking the memory cells, as illustrated in FIG. 1, is adopted in order to reduce the cost for each bit of the nonvolatile memory. When the TSV is used in the nonvolatile memory which is in the three-dimensional structure, the first contact plugs 32, which connect the first and second pad layers 18, 26, become very long. In addition, the aspect ratio of the first contact plugs 32 becomes very large.

Figure 3A:
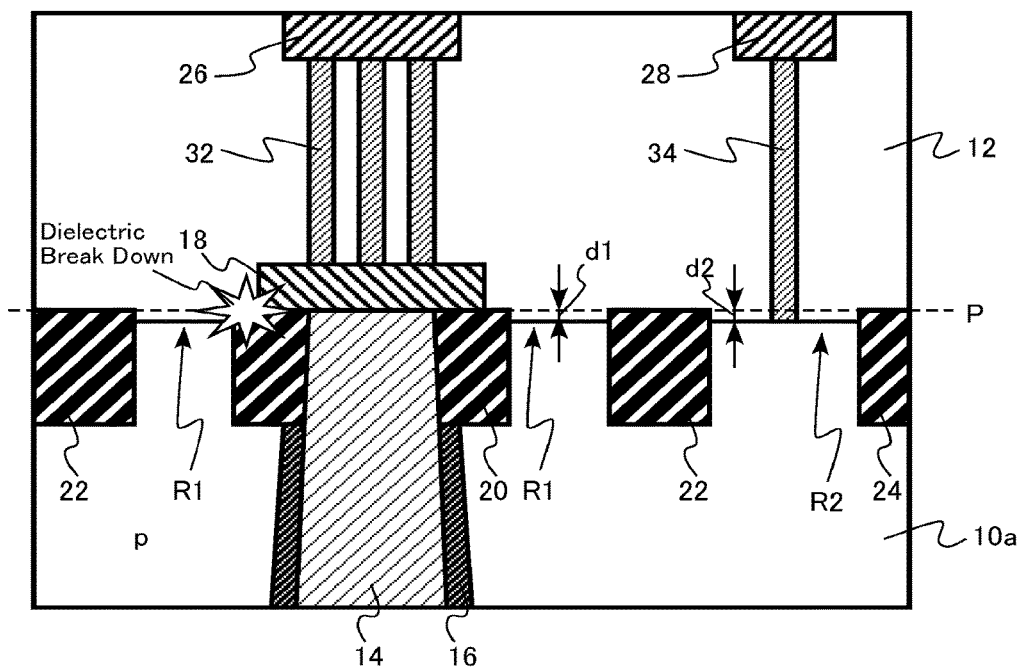
FIGS. 3A, 3B are schematic views of a semiconductor device according to a comparative example.
Figure 3B:
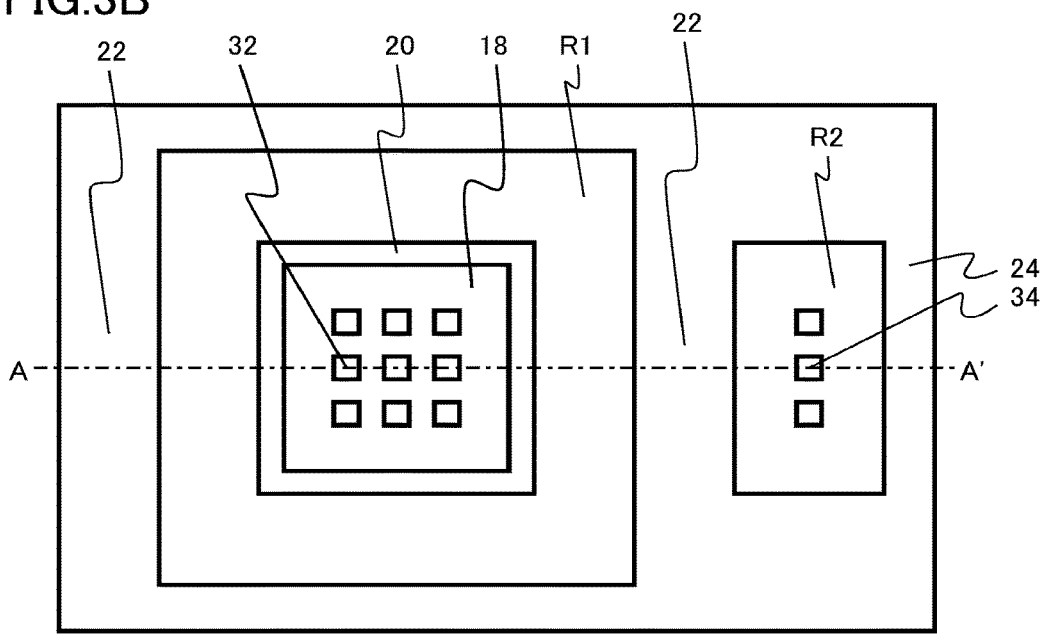

FIGS. 3A, 3B are schematic views of a semiconductor device of a comparative example. FIG. 3A is a cross-sectional view. FIG. 3B is a top view. FIG. 3A is a schematic cross-sectional view of main components of the comparative example. FIG. 3B is a top view of the main components of the comparative example. FIG. 3A is a cross-sectional view cut along line AA' of FIG. 3B.

In the semiconductor device of the comparative example, a distance (d1 in FIG. 3A) from the plane P to the first region R1 is equal to a distance (d2 in FIG. 3A) from the plane P to the second region R2. In other words, the distance from the back surface of the semiconductor substrate 10 to the front surface of the first region R1 is equal to the distance from the back surface of the semiconductor substrate 10 to the front surface of the second region R2.

Contact holes are formed in the interlayer insulating layer 12 to bury the first contact plugs 32 in the contact holes. The contact holes are formed by, for example, reactive ion etching (RIE).

The first pad layer 18 is charged up during the RIE in forming the contact holes. This causes dielectric breakdown between an end portion of the first pad layer 18 and the nearby semiconductor substrate 10. Specifically, dielectric breakdown occurs in a part of the first buried insulating layer 20 or the interlayer insulating layer 12. The dielectric breakdown causes a leak current to flow between the first pad layer 18 and the semiconductor substrate 10, whereby malfunction occurs in the nonvolatile memory.

In particular, the nonvolatile memory formed in the three-dimensional structure requires very long first contact plugs 32 as described above. This causes, for example, an increase of etching time in forming the contact holes and an increase of the charge-up amount of the first pad layer 18. Meanwhile, high-power etching conditions are selected to achieve the contact holes having a large aspect ratio, increasing the charge-up amount of the first pad layer 18. The dielectric breakdown, therefore, occurs easily.

The increase of the length of the first contact plugs 32 leads to the increase of resistance of the first contact plugs 32. The increase of the resistance of the first contact plugs 32 causes an increase of resistance between the front bump 38 and the back bump 40. This problem can be solved by increasing the number of the first contact plugs 32 per unit area.

However, increasing the number of the first contact plugs 32 per unit area would increase a density of the contact holes to be formed per unit area. This increases the charge-up amount of the first pad layer 18 and causes the dielectric breakdown to occur easily.

In the semiconductor device of the present embodiment, the distance (d1 in FIG. 2A) from the plane P to the first region R1 is longer than the distance (d2 in FIG. 2A) from the plane P to the second region R2. In other words, the distance between the first pad layer 18 and the semiconductor substrate 10 near the first pad layer 18 becomes longer than the distance of the comparative example. This leads to a decrease of the electric field intensity between the end portion of the first pad layer 18 and the nearby semiconductor substrate 10. This decreases the dielectric breakdown between the end portion of the first pad layer 18 and the nearby semiconductor substrate 10.

The distance d1 is preferably at least 1.5 times longer, and more preferably at least 2 times longer than the distance d2, in order to decrease the dielectric breakdown. A difference between the distance d1 and the distance d2 is preferably at least 20 nm, and more preferably at least 30 nm.

The present embodiment can achieve the semiconductor device in which the dielectric breakdown is decreased in manufacturing.

Second Embodiment

A semiconductor device of the present embodiment includes a fourth conductive layer and a third insulating layer. The third insulating layer is provided between the fourth conductive layer and the first region. A distance from a second interface between the fourth conductive layer and the third insulating layer to the first region is smaller than the distance from the plane to the first region. Other portions of the semiconductor device of the present embodiment are similar to those of the first embodiment. The description of portions overlapping those of the first embodiment will not be repeated.

Figure 4A:
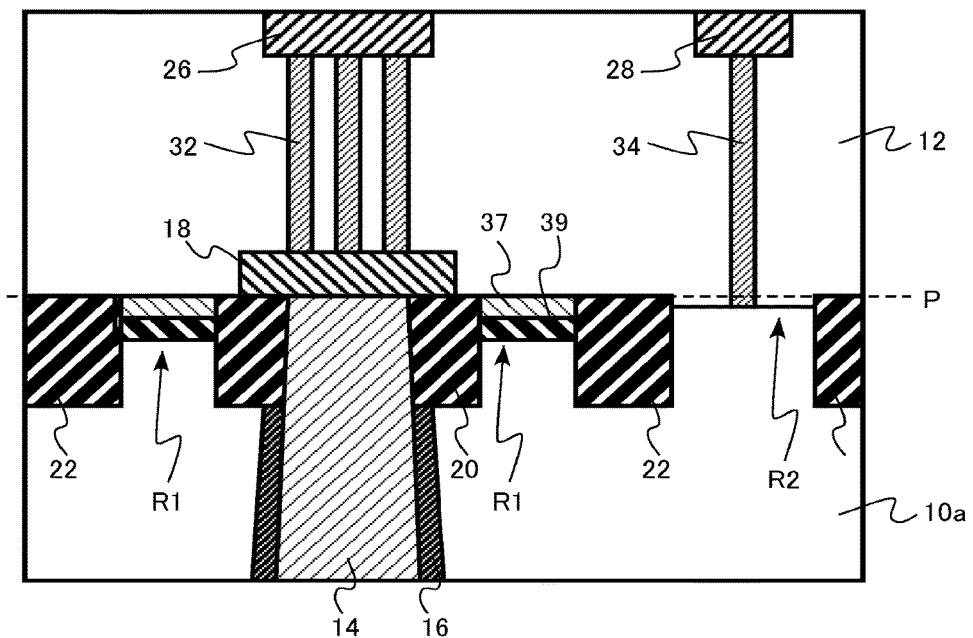
FIGS. 4A, 4B are schematic views of a semiconductor device according to a second embodiment.
Figure 4B:
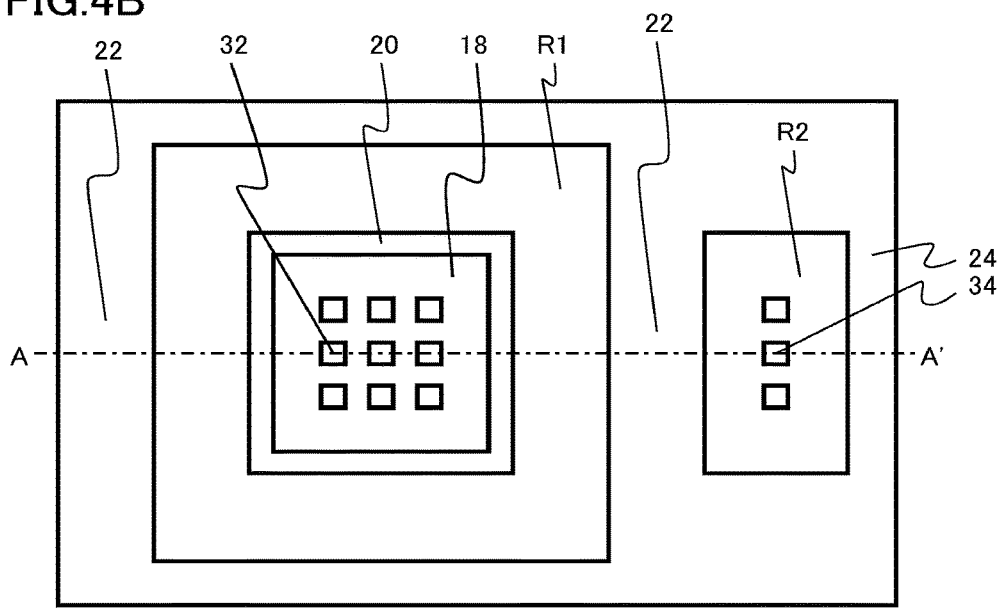

FIGS. 4A, 4B are schematic views of the semiconductor device of the present embodiment. FIG. 4A is a schematic cross-sectional view of main components of the present embodiment. FIG. 4B is a top view of the main components of the present embodiment. FIG. 4A is a cross-sectional view cut along line AA' of FIG. 4B.

A nonvolatile memory of the present embodiment includes a conductive layer 37 (fourth conductive layer) and an insulating film 39 (third insulating layer).

The conductive layer 37 is made of, for example, polycrystalline silicon in which a conductive impurity is introduced.

The insulating film 39 is provided between the conductive layer 37 and the semiconductor substrate 10. The insulating film 39 is made of, for example, silicon oxide. The insulating film 39 is, for example, a thermal oxide film.

A plane including an interface between the first pad layer 18 and the first buried insulating layer 20 is defined as a plane P (indicated by a broken line in FIG. 4A). A distance from the plane P to the first region R1 is longer than a distance from the plane P to the second region R2.

The distance from the interface (second interface) between the conductive layer 37 and the insulating film 39 to the first region R1 is smaller than the distance from the plane P to the first region R1. In other words, the interface between the conductive layer 37 and the insulating film 39 is located on the semiconductor substrate 10 side compared to the top surface of the first buried insulating layer 20.

In the present embodiment, the conductive layer 37 and the insulating film 39 are sandwiched between the first pad layer 18 and the semiconductor substrate 10 near the first pad layer 18. This structure decreases field intensity between the end portion of the first pad layer 18 and the nearby semiconductor substrate 10. This further decreases the dielectric breakdown in manufacturing the semiconductor device.

The present embodiment can achieve the semiconductor device in which the dielectric breakdown in manufacturing is further decreased compared to the first embodiment.

Third Embodiment

A semiconductor device of the present embodiment includes a semiconductor layer including a semiconductor layer including a first semiconductor region of a first-conductivity type, a second semiconductor region of a second-conductivity type, and a third semiconductor region of the first-conductivity type, the second semiconductor region being located between the third semiconductor region and the first semiconductor region, a first conductor provided in the first semiconductor region, a first conductive layer electrically connected to the first conductor, a first insulating layer, at least a part of the first insulating layer being provided in the semiconductor layer, at least a part of the first insulating layer being provided between the first conductive layer and the first semiconductor region, the first insulating layer surrounding the first conductor, a second insulating layer, at least a part of the second insulating layer being provided in the semiconductor layer, the second semiconductor region being located between the second insulating layer and the first insulating layer, the third semiconductor region located between the second insulating layer and the first insulating layer, a first end portion of the first conductive layer located between the second insulating layer and the first insulating layer, a second conductive layer, the first conductive layer being interposed between the second conductive layer and the first conductor; and a plurality of second conductors provided between the second conductive layer and the first conductive layer, the plurality of second conductors electrically connecting the second conductive layer and the first conductive layer.

The semiconductor device of the present embodiment differs from the semiconductor device of the first embodiment in that the semiconductor layer includes the first semiconductor region of the first-conductivity type, the second semiconductor region of the second-conductivity type, and the third semiconductor region of the first-conductivity type. The present embodiment also differs from the first embodiment in that the front surface of the first region R1 and the front surface of the second region R2 are in an approximately same plane. The present embodiment also differs from the first embodiment in the shape of the first conductive layer. The present embodiment is similar to the first embodiment except for the structure of the semiconductor layer and the first conductive layer. The description of portions overlapping those of the first embodiment will not be repeated.

Figure 5:
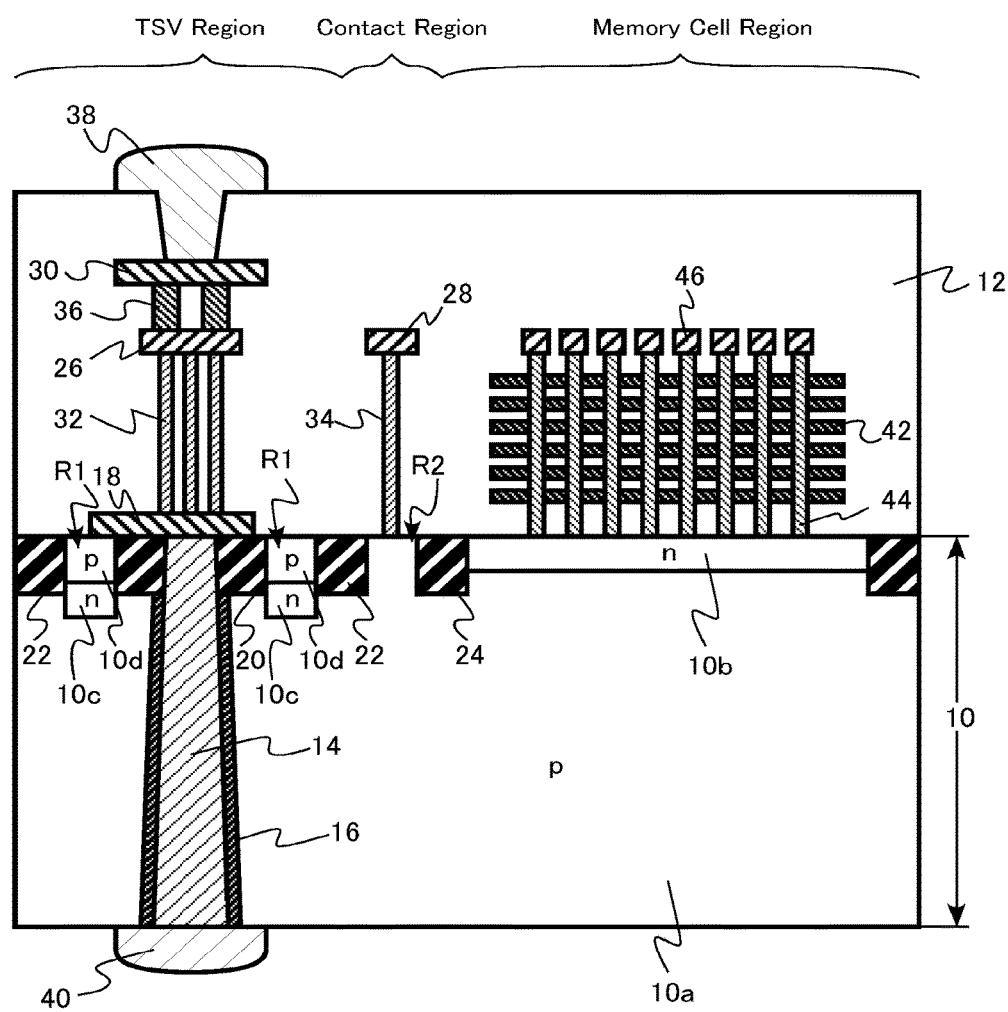
FIG. 5 is a schematic view of a semiconductor device according to a third embodiment.
Figure 6A:
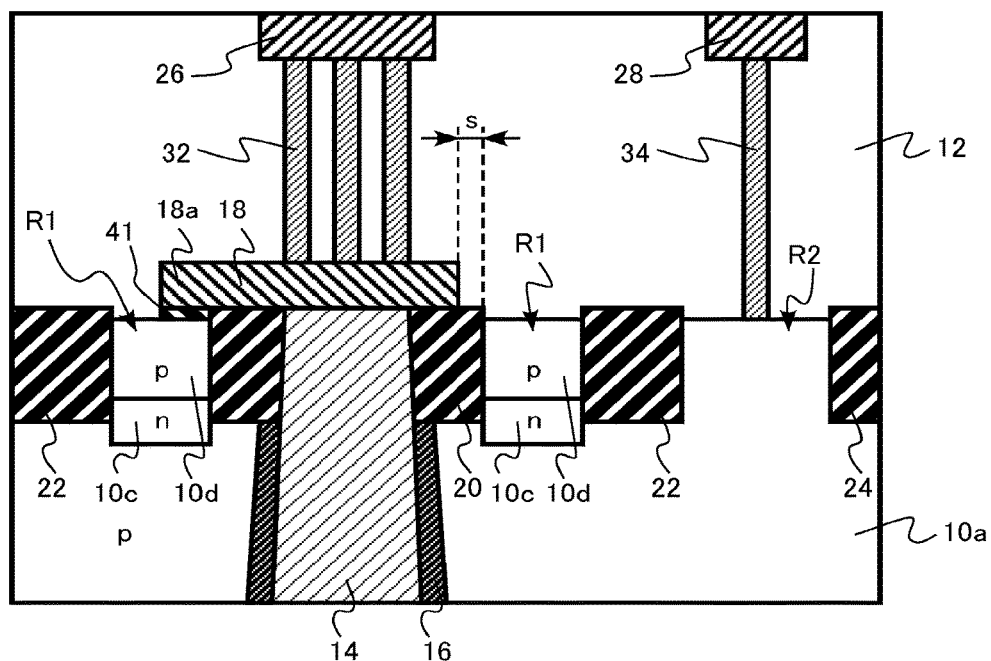
FIGS. 6A, 6B are schematic views of the semiconductor device according to the third embodiment.
Figure 6B:
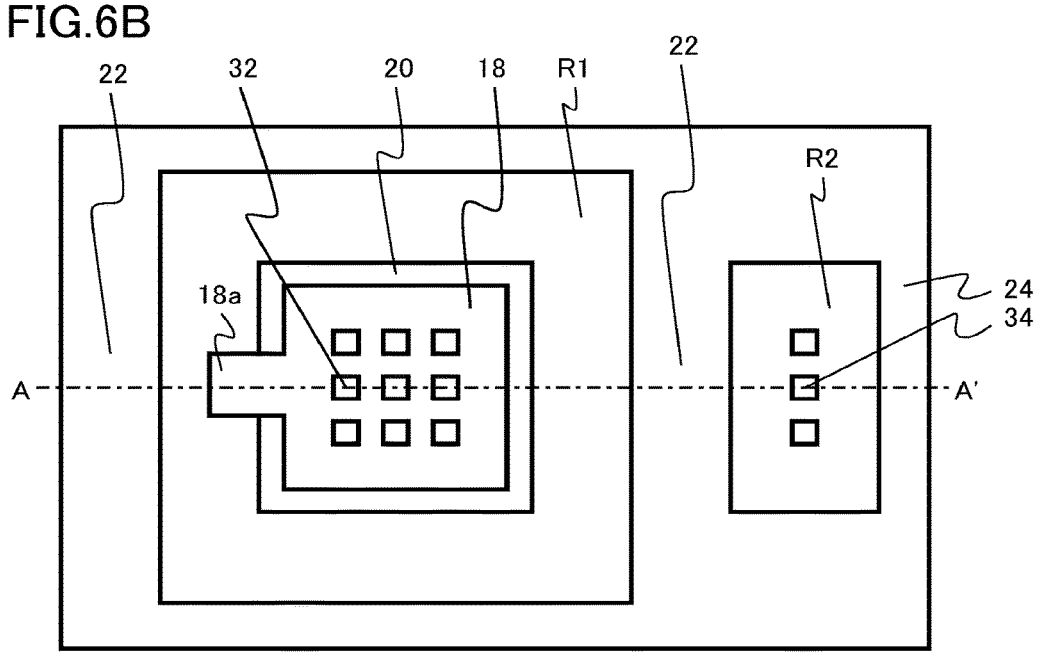

FIGS. 5, 6A, 6B are schematic views of a semiconductor device of the present embodiment. FIG. 5 is a schematic cross-sectional view of the semiconductor device of the present embodiment. FIG. 6A is a schematic cross-sectional view of main components of the present embodiment. FIG. 6B is a top view of the main components of the present embodiment. FIG. 6A is a cross-sectional view cut along line AA' of FIG. 6B.

The semiconductor device of the present embodiment is a NAND-type nonvolatile memory including the TSV. The nonvolatile memory of the present embodiment is in a three-dimensional structure including memory cells distributed three-dimensionally.

The nonvolatile memory of the embodiment includes a TSV region, a contact region, and a memory cell region. FIGS. 6A, 6B are enlarged views of the TSV region and the contact regions, respectively.

The nonvolatile memory of the present embodiment includes a semiconductor substrate 10 (semiconductor layer), an interlayer insulating layer 12, a through-via (first conductor) 14, a sidewall insulating film 16, a first pad layer 18 (first conductive layer), a first buried insulating layer 20 (first insulating layer), a second buried insulating layer 22 (second insulating layer), a third buried insulating layer 24, a second pad layer 26 (second conductive layer), a wiring layer 28 (third conductive layer), a third pad layer 30, a first contact plug 32 (second conductor), a second contact plug 34 (third conductor), a third contact plug 36, a front bump 38, a back bump 40, a word line 42, a channel layer 44, and a bit line 46.

The semiconductor substrate 10 includes a front surface and a back surface. The front surface is an upper surface and the back surface is a lower surface in FIG. 5. The semiconductor substrate 10 includes a first p-type region 10a (first semiconductor region), an n-type source region 10b, a first n-type region 10c (second semiconductor region), and a second p-type region 10d (third semiconductor region).

The through-via 14 is provided in the first p-type region 10a.

The semiconductor substrate 10 includes a first region R1 and a second region R2 on the front surface side. A distance between the first region R1 and the first buried insulating layer 20 is smaller than a distance between the second region R2 and the first buried insulating layer 20.

At least part of the first buried insulating layer 20 is provided between the first pad layer 18 and the first p-type region 10a. The first region R1 is provided to surround the first buried insulating layer 20.

The first n-type region 10c is provided between the first buried insulating layer 20 and the second buried insulating layer 22. The second p-type region 10d is provided between the first buried insulating layer 20 and the second buried insulating layer 22. The first n-type region 10c is located between the first p-type region 10a and the second p-type region 10d.

The first pad layer 18 includes a protrusion 18a. An end portion (first end portion) of the protrusion 18a is located between the first buried insulating layer 20 and the second buried insulating layer 22. The end portion of the protrusion 18a is located on the second p-type region 10d. The protrusion 18a acts as a protection element.

An insulating film 41 is provided between the protrusion 18a and the second p-type region 10d. The insulating film 41 is made of, for example, silicon oxide. The insulating film 41 has a film thickness thinner than the thickness of the first buried insulating layer 20. The film thickness of the insulating film 41 is, for example, from 5 nm to 20 nm.

An end portion (second end portion) of the first pad layer 18 opposite to the protrusion 18a is located on the first buried insulating layer 20. A distance (s in FIG. 6A) from the end portion of opposite to the protrusion 18a to the end portion of the first buried insulating layer 20 is, for example, from 150 nm to 300 nm.

Next, a function and an effect of the semiconductor device of the present embodiment is described.

The first pad layer 18 is charged up in forming contact holes of the first contact plugs 32, as mentioned above. This causes dielectric breakdown to occur between the end portion of the first pad layer 18 and the nearby semiconductor substrate 10. Specifically, the dielectric breakdown occurs in a part of the first buried insulating layer 20 or the interlayer insulating layer 12. The dielectric breakdown causes a leak current to flow between the first pad layer 18 and the semiconductor substrate 10, whereby malfunction occurs in the nonvolatile memory.

The first pad layer 18 of the nonvolatile memory of the present embodiment includes the protrusion 18a located on the semiconductor substrate 10. The protrusion 18a is closer to the semiconductor substrate 10 than other regions of the first pad layer 18. The dielectric breakdown resistance of the protrusion 18a is lower than in other regions of the first pad layer 18. Thus, the dielectric breakdown occurs easily in the protrusion 18a when the first pad layer 18 is charged up.

If the dielectric breakdown occurs in the protrusion 18a, the first p-type region 10a and the second p-type region 10d are electrically isolated from each other by the n-type region 10c. No leak current, therefore, flows between the first pad layer 18 and the first p-type region 10a. The malfunction of the nonvolatile memory does not occur.

The protrusion 18a of the first pad layer 18 may be in direct contact with the second p-type region 10d.

Thus, the protrusion 18a of the first pad layer 18 acts as the protection element in the nonvolatile memory of the present embodiment.

If the protection element is not provided, as in the comparative example illustrated in FIGS. 3A, 3B, the distance (s in FIG. 6A) between the end portion of the first pad layer 18 and the semiconductor substrate 10 needs to be longer than a predetermined distance, in order to decrease the dielectric breakdown in forming the contact holes of the first contact plugs 32. The distance is, for example, at least 1 μm.

Since the protection element is provided in the present embodiment, the distance (s in FIG. 6A) between the end portion of the first pad layer 18 and the semiconductor substrate 10 can be reduced to, for example, below 300 nm. The chip area, therefore, can be decreased.

Preferably, the first n-type region 10c is connected to a fixed potential, such as a positive fixed potential, in order to achieve a stable operation of the nonvolatile memory.

The present embodiment can achieve the semiconductor device without malfunction even when the dielectric breakdown occurs in manufacturing. In addition, the chip area can be decreased.

Fourth Embodiment

A semiconductor device of the present embodiment is similar to the semiconductor device of the third embodiment except that the entire end portion of the first conductive layer is located on the semiconductor layer. The description of portions overlapping those of the third embodiment will not be repeated.

Figure 7A:
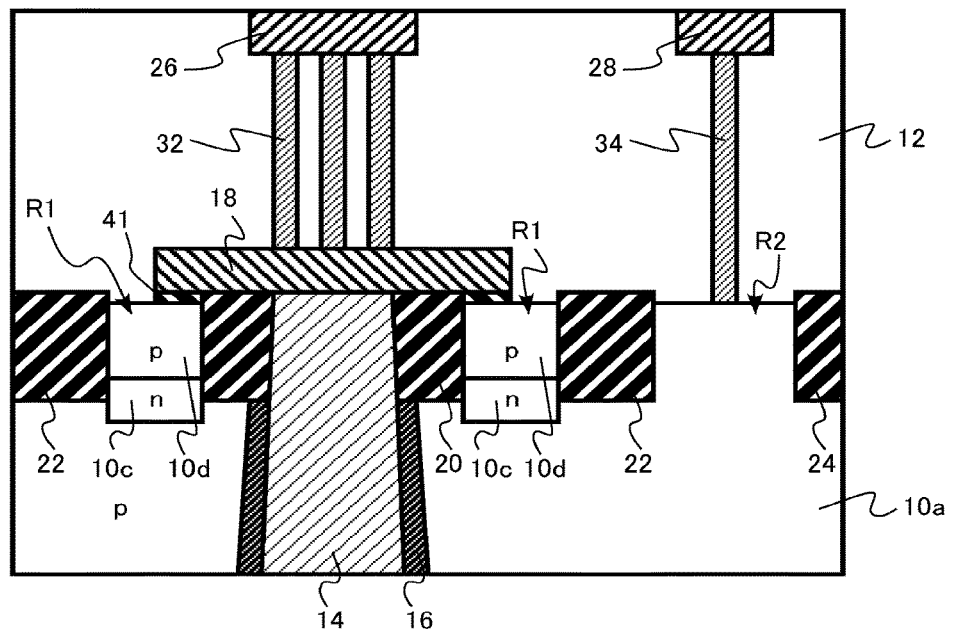
FIGS. 7A, 7B are schematic views of a semiconductor device according to a fourth embodiment.
Figure 7B:
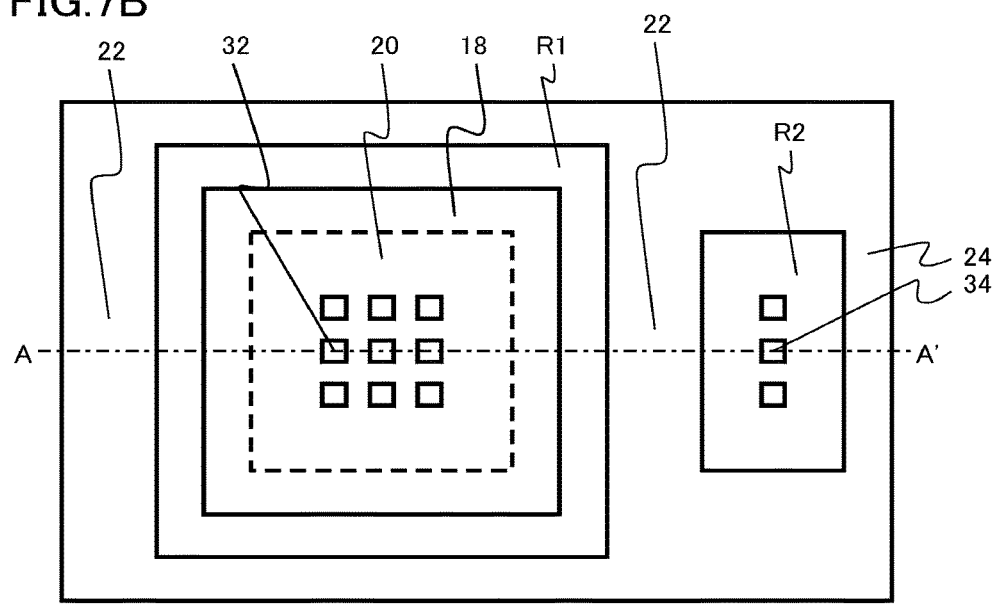

FIGS. 7A, 7B are schematic views of the semiconductor device of the present embodiment. FIG. 7A is a schematic cross-sectional view of main components of the present embodiment. FIG. 7B is a top view of the main components of the present embodiment. FIG. 7A is a cross-sectional view cut along line AA' of FIG. 7B.

The entire end portion of the first pad layer 18 is located between the first buried insulating layer 20 and the second buried insulating layer 22. The entire end portion of the first pad layer 18 is located on the second p-type region 10d. The end portion of the first buried insulating layer 20 is surrounded by the end portion of the first pad layer 18. The outer periphery of the first pad layer 18 acts as the protection element.

An insulating film 41 is provided between the outer periphery of the first pad layer 18 and the second p-type region 10d. The insulating film 41 is made of, for example, silicon oxide.

The pattern of the protection element of the present embodiment is more symmetric than the pattern of the third embodiment. The protection element, therefore, has a stable characteristic.

As in the third embodiment, the present embodiment can achieve the semiconductor device without malfunction even when the dielectric breakdown occurs in manufacturing. In addition, the protection element has a more stable characteristic than the third embodiment.

Fifth Embodiment

A semiconductor device of the present embodiment is similar to the semiconductor device of the fourth embodiment except that the semiconductor layer includes a fourth semiconductor region of the second-conductivity type between the first conductive layer and the third semiconductor region. The description of portions overlapping those of the third embodiment will not be repeated.

Figure 8A:
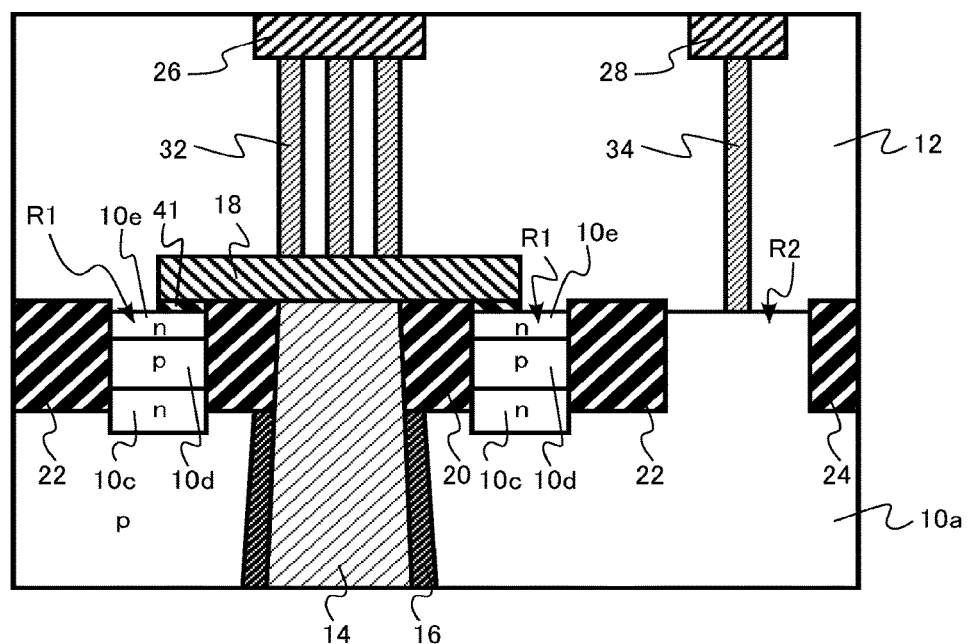
FIGS. 8A, 8B are schematic views of a semiconductor device according to a fifth embodiment.
Figure 8B:
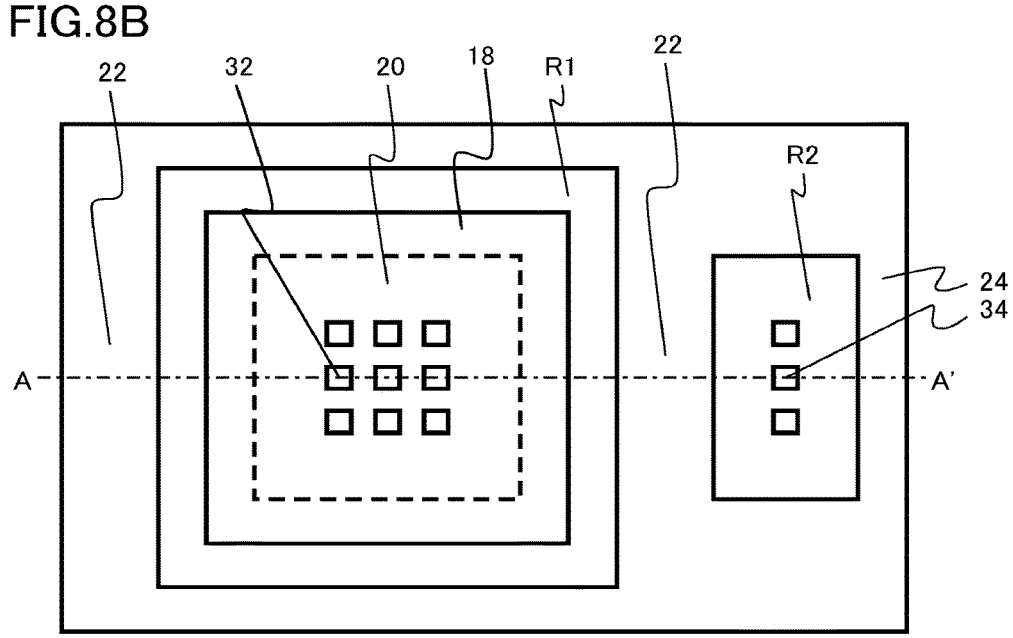

FIGS. 8A, 8B are schematic views of the semiconductor device of the present embodiment. FIG. 8A is a schematic cross-sectional view of main components of the present embodiment. FIG. 8B is a top view of the main components of the present embodiment. FIG. 8A is a cross-sectional view cut along line AA' of FIG. 8B.

The nonvolatile memory of the present embodiment includes a second n-type region 10e (fourth semiconductor region) between the first pad layer 18 and the second p-type region 10d.

The entire end portion of the first pad layer 18 is located between the first buried insulating layer 20 and the second buried insulating layer 22. The entire end portion of the first pad layer 18 is located on the second n-type region 10e. The outer periphery of the first pad layer 18 acts as the protection element.

In the present embodiment, many electrons having negative charge are present in the second n-type region 10e. This lowers the dielectric breakdown voltage of the protection element when, for example, the first pad layer 18 is positively charged in forming the contact holes. The protection element, therefore, acts effectively.

As in the fourth embodiment, the present embodiment can achieve the semiconductor device without malfunction even when the dielectric breakdown occurs in manufacturing.

Such a semiconductor device is particularly effective in a case in which the first pad layer 18 is positively charged.

Sixth Embodiment

A semiconductor device of the present embodiment is similar to the semiconductor device of the third embodiment except that the third semiconductor region located below the end portion (first end portion) of the first conductive layer is isolated. The description of portions overlapping those of the third embodiment will not be repeated.

Figure 9:
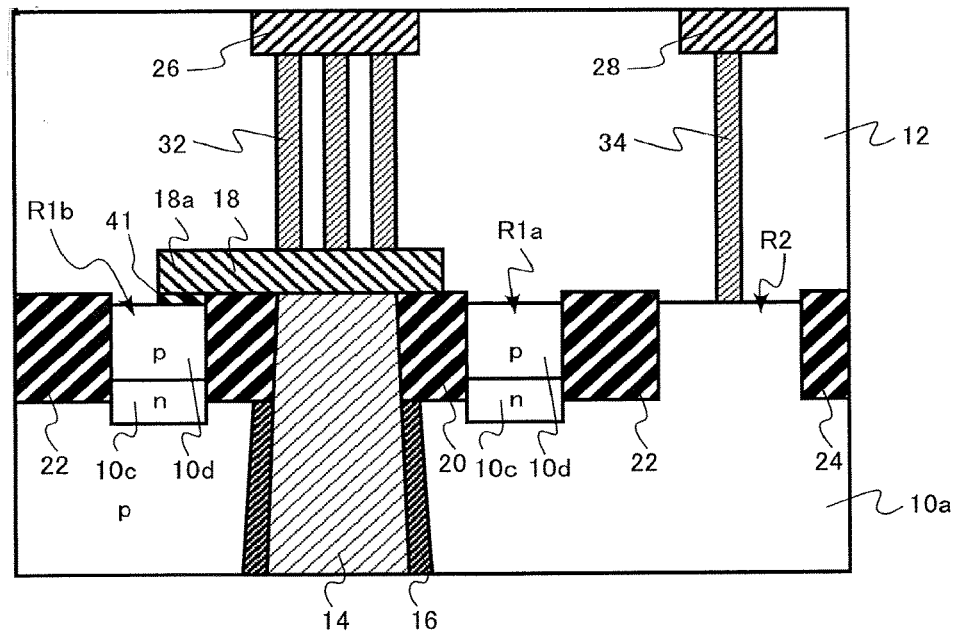
FIGS. 9A, 9B are schematic views of a semiconductor device according to a sixth embodiment.
Figure 9B:
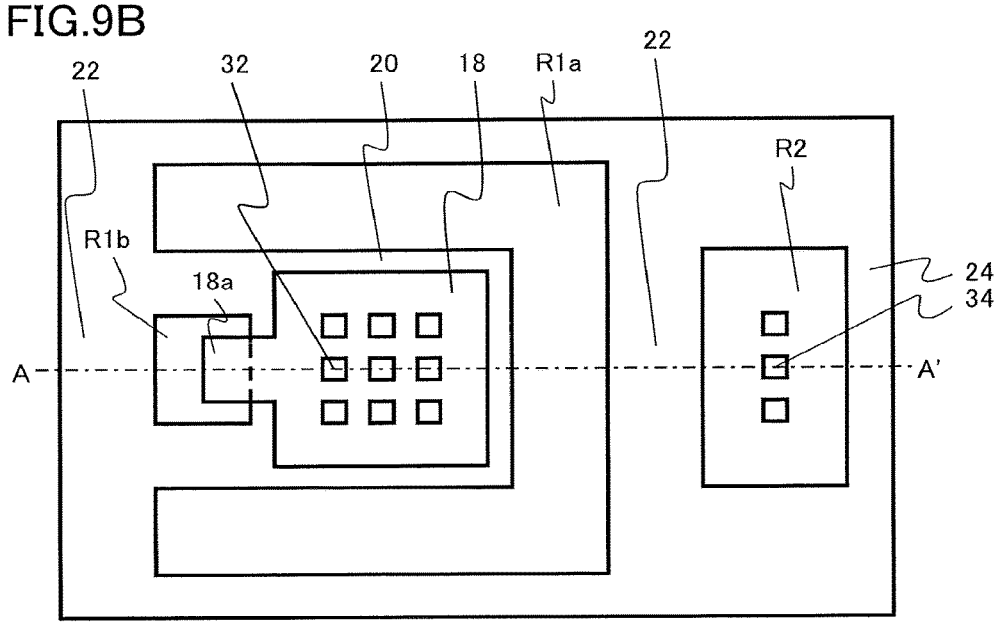

FIGS. 9A, 9B are schematic views of the semiconductor device of the present embodiment. FIG. 9A is a schematic cross-sectional view of main components of the present embodiment. FIG. 9B is a top view of the main components of the present embodiment. FIG. 9A is a cross-sectional view cut along line AA' of FIG. 9B.

A first region R1b located below the protrusion 18a of the first pad layer 18 is electrically and physically isolated from other portions of the first region R1a. The first buried insulating layer 20 and the second buried insulating layer 22 are provided physically and continuously to isolate the first region R1b and the first region R1a.

Since the protection element is isolated in the present embodiment, the influence on the operation of the nonvolatile memory would be decreased if the dielectric breakdown occurs in the protection element.

As in the third embodiment, the present embodiment can achieve the semiconductor device without malfunction even when the dielectric breakdown occurs in manufacturing. In addition, the influence on the semiconductor device can be decreased.

Seventh Embodiment

A semiconductor device of the present embodiment includes a semiconductor layer including a first semiconductor region of a first-conductivity type, a second semiconductor region of a second-conductivity type, and a third semiconductor region of the first-conductivity type, the second semiconductor region being located between the third semiconductor region and the first semiconductor region, a first conductor provided in the first semiconductor region, a first conductive layer electrically connected to the first conductor, a first insulating layer, at least a part of the first insulating layer being provided in the semiconductor layer, at least a part of the first insulating layer being provided between the first conductive layer and the first semiconductor region, the first insulating layer surrounding the first conductor, the first insulating layer surrounded by the second semiconductor region and the third semiconductor region, a second insulating layer, at least a part of the second insulating layer provided in the semiconductor layer, the second insulating surrounding the first insulating layer, the second semiconductor region located between the second insulating layer and the first insulating layer, the third semiconductor region located between the second insulating layer and the first insulating layer, a second conductive layer, the first conductive layer being interposed between the second conductive layer and the first conductor; and a plurality of second conductors provided between the second conductive layer and the first conductive layer, the plurality of second conductors electrically connecting the second conductive layer and the first conductive layer.

A semiconductor device of the present embodiment is similar to the semiconductor device of the fourth embodiment except that the entire end portion of the first conductive layer is located on the first insulating layer. The description of portions overlapping those of the fourth embodiment will not be repeated.

Figure 10A:
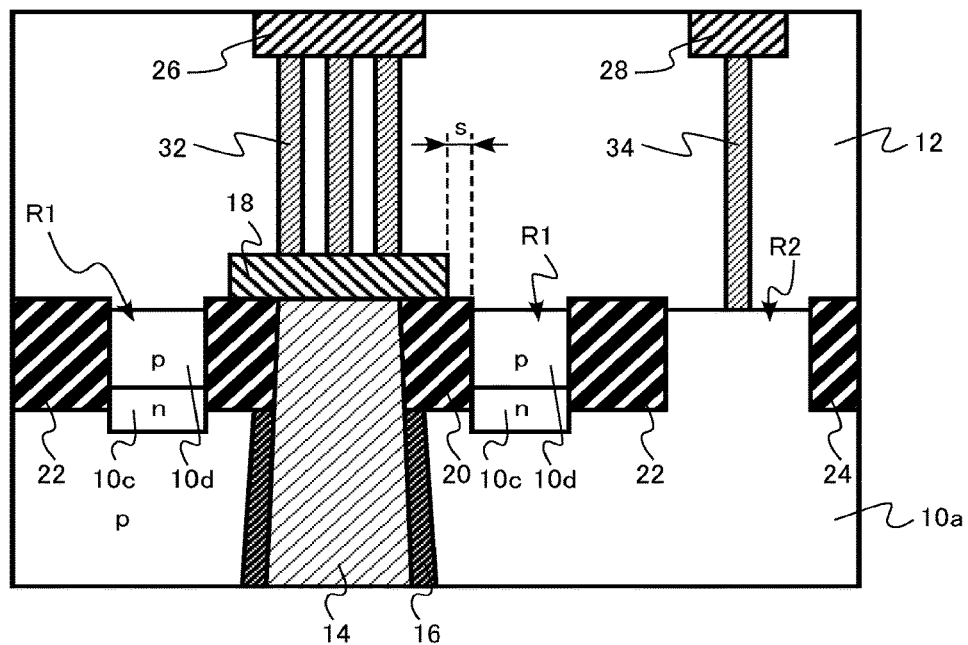
FIGS. 10A, 10B are schematic views of a semiconductor device according to a seventh embodiment.
Figure 10B:
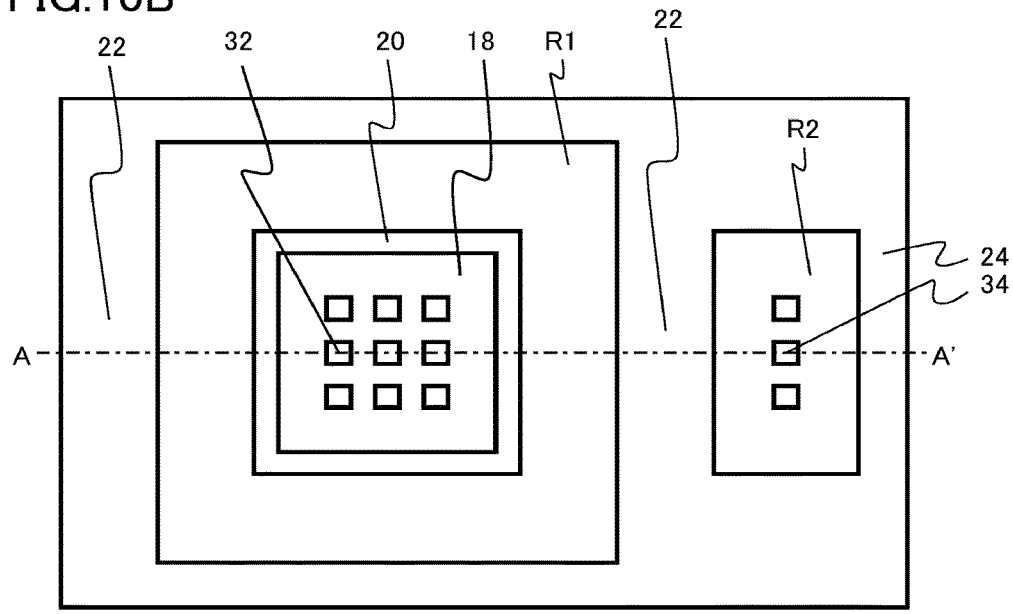

FIGS. 10A, 10B are schematic views of the semiconductor device of the present embodiment. FIG. 10A is a schematic cross-sectional view of main components of the present embodiment. FIG. 10B is a top view of the main components of the present embodiment. FIG. 10A is a cross-sectional view cut along line AA' of FIG. 10B.

The entire end portion of the first pad layer 18 is located on the first buried insulating layer 20. The end portion of the first pad layer 18 is surrounded by the end portion of the first buried insulating layer 20.

The first buried insulating layer 20 is surrounded by the second p-type region 10d and the first n-type region 10c. The second buried insulating layer 22 is provided by surrounding the first buried insulating layer 20. The second p-type region 10d is located between the first buried insulating layer 20 and the second buried insulating layer 22. The first n-type region 10c is located between the first buried insulating layer 20 and the second buried insulating layer 22.

Unlike the fourth embodiment, the outer periphery of the first pad layer 18 does not always act as the protection element. If, however, the dielectric breakdown occurs, the first p-type region 10a and the second p-type region 10d are electrically isolated from each other by the first n-type region 10c. No leak current, therefore, flows between the first pad layer 18 and the first p-type region 10a. The malfunction of the nonvolatile memory does not occur.

As in the third embodiment, the distance (s in FIG. 10A) between the end portion of the first pad layer 18 and the semiconductor substrate 10 can be decreased to, for example, 300 nm. The chip area, therefore, can be decreased.

As in the fourth embodiment, the present embodiment can achieve the semiconductor device without malfunction even when the dielectric breakdown occurs in manufacturing. In addition, the chip area can be decreased.

The above embodiments have been described using the nonvolatile memory as one example of the semiconductor device, but the present disclosure can be used in other semiconductor devices.

While certain embodiments have been described, these embodiments have been presented by way of example only, and are not intended to limit the scope of the inventions. Indeed, semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device, comprising:
a semiconductor layer having a first region and a second region;
a first conductor provided in the semiconductor layer;
a first conductive layer electrically connected to the first conductor;
a first insulating layer, at least a part of the first insulating layer being provided in the semiconductor layer, at least a part of the first insulating layer being provided between the first conductive layer and the semiconductor layer, the first insulating layer surrounding the first conductor, a distance from the first insulating layer to the first region being smaller than a distance from the first insulating layer to the second region, a first distance to the first region from a plane that includes a first interface between the first insulating layer and the first conductive layer being larger than a second distance to the second region from the plane;
a second conductive layer, the first conductive layer being interposed between the second conductive layer and the first conductor;
a plurality of second conductors provided between the second conductive layer and the first conductive layer, the plurality of second conductors electrically connecting the second conductive layer and the first conductive layer;
a third conductive layer; and
a third conductor provided between the third conductive layer and the second region, the third conductor electrically connecting the third conductive layer and the second region.

2. The semiconductor device according to claim 1, further comprising:
a second insulating layer, at least a part of the second insulating layer provided in the semiconductor layer, the second insulating layer located between the first region and the second region.

3. The semiconductor device according to claim 1, wherein
the second conductors have an aspect ratio of at least 20.

4. The semiconductor device according to claim 1, further comprising:
an insulating film provided between the first conductor and the semiconductor layer.

5. The semiconductor device according to claim 1, wherein
the semiconductor layer is made of silicon.

6. The semiconductor device according to claim 1, wherein
the semiconductor layer has a thickness of at least 30 μm.

7. A semiconductor device comprising:
a semiconductor layer having a first region and a second region;
a first conductor provided in the semiconductor layer;
a first conductive layer electrically connected to the first conductor;
a first insulating layer, at least a part of the first insulating layer being provided in the semiconductor layer, at least a part of the first insulating layer being provided between the first conductive layer and the semiconductor layer, the first insulating layer surrounding the first conductor, a distance from the first insulating layer to the first region being smaller than a distance from the first insulating layer to the second region, a first distance to the first region from a plane that includes a first interface between the first insulating layer and the first conductive layer being larger than a second distance to the second region from the plane;
a second conductive layer, the first conductive layer being interposed between the second conductive layer and the first conductor;
a plurality of second conductors provided between the second conductive layer and the first conductive layer, the plurality of second conductors electrically connecting the second conductive layer and the first conductive layer;
a fourth conductive layer; and
a third insulating layer provided between the fourth conductive layer and the first region, a distance from a second interface between the third insulating layer and the fourth conductive layer to the first region is smaller than a distance from the plane to the first region.

8. A semiconductor device, comprising:
a semiconductor layer including
a first semiconductor region of a first-conductivity type,
a second semiconductor region of a second-conductivity type, and
a third semiconductor region of the first-conductivity type, the second semiconductor region being located between the third semiconductor region and the first semiconductor region;
a first conductor provided in the first semiconductor region;
a first conductive layer electrically connected to the first conductor;
a first insulating layer, at least a part of the first insulating layer being provided in the semiconductor layer, at least a part of the first insulating layer being provided between the first conductive layer and the first semiconductor region, the first insulating layer surrounding the first conductor;
a second insulating layer, at least a part of the second insulating layer being provided in the semiconductor layer, the second semiconductor region being located between the second insulating layer and the first insulating layer, the third semiconductor region located between the second insulating layer and the first insulating layer, a first end portion of the first conductive layer located between the second insulating layer and the first insulating layer;
a second conductive layer, the first conductive layer being interposed between the second conductive layer and the first conductor; and
a plurality of second conductors provided between the second conductive layer and the first conductive layer, the plurality of second conductors electrically connecting the second conductive layer and the first conductive layer.

9. The semiconductor device according to claim 8, wherein
the semiconductor layer includes a fourth semiconductor region of the second-conductivity type between the first conductive layer and the third semiconductor region.

10. The semiconductor device according to claim 8, wherein
a second end portion of the first conductive layer is located on the first insulating layer, and
a distance from the second end portion to an end portion of the first insulating layer is from 150 nm to 300 nm.

11. The semiconductor device according to claim 8, wherein
the second conductors have an aspect ratio of at least 20.

12. The semiconductor device according to claim 8, further comprising:
an insulating film provided between the first conductor and the semiconductor layer.

13. The semiconductor device according to claim 8, wherein
the semiconductor layer is made of silicon.

14. The semiconductor device according to claim 8, wherein
the semiconductor layer has a thickness of at least 30 μm.

15. A semiconductor device, comprising:
a semiconductor layer including
a first semiconductor region of a first-conductivity type,
a second semiconductor region of a second-conductivity type, and a third semiconductor region of the first-conductivity type, the second semiconductor region being located between the third semiconductor region and the first semiconductor region;

a first conductor provided in the first semiconductor region;

a first conductive layer electrically connected to the first conductor;

a first insulating layer, at least a part of the first insulating layer being provided in the semiconductor layer, at least a part of the first insulating layer being provided between the first conductive layer and the first semiconductor region, the first insulating layer surrounding the first conductor, the first insulating layer surrounded by the second semiconductor region and the third semiconductor region;

a second insulating layer, at least a part of the second insulating layer provided in the semiconductor layer, the second insulating layer surrounding the first insulating layer, the second semiconductor region located between the second insulating layer and the first insulating layer, the third semiconductor region located between the second insulating layer and the first insulating layer;

a second conductive layer, the first conductive layer being interposed between the second conductive layer and the first conductor; and a plurality of second conductors provided between the second conductive layer and the first conductive layer, the plurality of second conductors electrically connecting the second conductive layer and the first conductive layer.

16. The semiconductor device according to claim 15, wherein an end of the first conductive layer is surrounded by an end of the first insulating layer.

17. The semiconductor device according to claim 15, wherein the second conductors have an aspect ratio of at least 20.

18. The semiconductor device according to claim 15, further comprising:

an insulating film provided between the first conductor and the semiconductor layer.

19. The semiconductor device according to claim 15, wherein the semiconductor layer is made of silicon.

* * * * *